United States Patent [19]
Jaeger et al.

[11] Patent Number: 5,715,142
[45] Date of Patent: Feb. 3, 1998

[54] ELECTRONIC POWER MODULE

[75] Inventors: Gérard Jaeger, Blonay; Rudolf Dinger, St-Aubin, both of Switzerland

[73] Assignee: Asulab S.A., Bienne, Switzerland

[21] Appl. No.: 619,980

[22] Filed: Mar. 20, 1996

[30] Foreign Application Priority Data

Mar. 21, 1995 [FR] France .................. 95 03279

[51] Int. Cl.⁶ .................................................. H05K 7/20
[52] U.S. Cl. ..................... 361/718; 257/713; 257/726; 361/707
[58] Field of Search ........................... 263/150, 158, 263/160; 24/457, 458, 625; 248/316.7, 505–510; 165/80.3, 185; 174/16.3; 257/706, 707, 711, 713, 717–719, 723–726, 727; 361/690, 704, 707, 709, 711, 712, 713, 715, 717, 718, 720, 722

[56] References Cited

U.S. PATENT DOCUMENTS

| | | | |
|---|---|---|---|
| 4,523,219 | 6/1985 | Heidegger et al. | 357/79 |
| 4,538,168 | 8/1985 | Soerwyn | 357/72 |
| 4,559,580 | 12/1985 | Lutfy | 361/385 |
| 4,612,601 | 9/1986 | Watari | 361/387 |
| 4,694,322 | 9/1987 | Sakurai | 357/74 |
| 4,739,447 | 4/1988 | Lecomte | 361/386 |
| 4,899,255 | 2/1990 | Case et al. | 361/386 |
| 5,225,965 | 7/1993 | Bailey | 361/704 |

FOREIGN PATENT DOCUMENTS

| 0 532 244 A1 | 3/1993 | European Pat. Off. |
| 0 619 605 | 10/1994 | European Pat. Off. |

*Primary Examiner*—Gerald P. Tolin
*Attorney, Agent, or Firm*—Griffin, Butler, Whisenhunt & Kurtossy

[57] ABSTRACT

The present invention concerns an electronic power module comprising several integrated power circuits which may, for example, be insulated gate bipolar transistors (IGBT).

10 Claims, 3 Drawing Sheets

ELECTRONIC POWER MODULE

The present invention concerns an electronic power module comprising several integrated power circuits which may be, for example, insulated grid bipolar transistors (IGBT).

Many integrated power circuit chips, in particular IGBTs, comprise two contact pads situated on opposite faces of the chip. These will be referred to respectively as the "upper" contact pad and the "lower" contact pad. When several chips are assembled parallel to each other in a same module, assuring the connection of the lower contact pads of the chip by means of a conducting substrate onto which they are stuck is known. In order to assure the connection of the upper contact pads of each of the chips individual connections via bonded aluminium wires are usually used.

The modules made in conformity with the above description have disadvantages. The strong currents intermittently circulating in the integrated power circuits of a module of this type produce considerable heat. This heat may be partially dissipated by the conducting substrate onto which the lower contact pads are stuck. However, the heat produced at the upper contact pads produces abrupt variations in temperature in the wire connections. These temperature variations generate considerable fatigue in the metal, which greatly reduces the reliability of the power module.

A first aim of the invention is to provide a power module in which the reliability of the means for electrically connecting the integrated power circuit upper contact pads is not sensitive to abrupt temperature variations.

A second aim of the present invention is to provide a power module in which the heat produced by the integrated power circuits at their upper contact pads may be dissipated without producing excessive temperature variations.

Patent application EP 0 532 244 A1 already discloses a power module designed to achieve the two aforementioned aims. The power module disclosed in this prior document has a shape reminiscent of a jam jar in which the integrated power circuits are arranged side by side in parallel at the base of the jar. Contact elements in the form of a plate and a spring are provided to supply a path for the heat and the electricity between, on the one hand, the contact pads and each chip and, on the other hand, the lower and upper walls of the module (the base and the lid of the jar). The contact elements are arranged against the lower face and the upper face of the chip. Finally, the spring, which is compressed between the upper contact element and the upper wall of the module is provided to return the chip and the contact elements in the direction of the lower wall of the module. It will be understood that the construction which has just been described forms a sandwich structure in which all the elements are compressed between the upper wall and the lower wall of the module.

The sandwich construction which has just been described has disadvantages. It will be noted in particular that it only allows modules in which the integrated power circuits are connected in parallel to be achieved. Indeed, patent application EP 0 532 244 A1 teaches how to assemble several modules when one wishes to achieve assemblies connected in more complex ways. It will be noted, on the other hand, that the use of a spring working in compression to drive heat requires the provision of heat dissipating means from both above and below the power module, which may be a disadvantageous constraint.

Another aim of the present invention is thus to provide a power module able to accommodate integrated power circuits in accordance with multiple configurations.

Another aim of the present invention is to provide a power module which requires heat dissipating means on only one its sides, called the lower side.

The present invention therefore concerns an electronic power module comprising at least a first and a second integrated power circuits, each of said integrated circuits comprising two parallel faces which are opposite each other, each of said faces comprising an integrated circuit contact pad, said module also comprising electric connecting and thermal conductive means for, on the one hand, connecting said contact pads to the exterior of said module and on the other hand, dissipating the heat produced by said integrated circuits, said electric connecting and thermal conductive means comprising in particular fixing strips made of a heat conducting material and thermally connected to heat dissipating means, and upper connecting parts made in an electric and heat conducting material, said first integrated circuit being arranged between a first of said fixing strips and a first of said upper connecting parts, and said second integrated circuit being arranged between a second of said fixing strips and a second of said upper connecting parts, said first and second fixing strips each having an upper face parallel and opposite to a first of said faces, called the lower face, of one of said first and second integrated circuits, and said first and second upper connecting parts each comprising a lower face which is parallel and opposite to a second of said faces, called the upper face, of one of said first and second integrated circuits, a first and a second springs also being provided for biaising respectively said first and second upper connecting parts in the direction of said first and second fixing strips so as to compress said first and second integrated circuits and thus to make an electric and thermal contact between said integrated circuit faces and said electric connecting and thermal conductive means, said electronic power module being characterised in that said first and second springs are attached to said first and second fixing strips so as to work in tension.

As a result of these features, a power module of particularly simple construction and which is thus particularly economical is provided.

Other features and advantages of the present invention will appear during the description which follows, given solely by way of example and made with reference to the attached drawings.

BRIEF DESCRIPTION OF THE DRAWINGS

The embodiment of the present invention shown in FIGS. 1 to 4 comprises six IGBT type integrated power circuits. These IGBTs are divided into two groups of three connected in parallel, and these two groups of parallel components are then connected in series in conformity with the electronic diagram of FIG. 4. In FIG. 4, the six IGBTs are respectively referenced Q1 to Q6. The diagram of FIG. 4 is given to facilitate understanding of the following description. However, the present invention does not in any way concern any particular interconnection diagram for the electronic components of a module and, consequently, FIG. 4 will not be commented upon in further detail.

FIG. 1 is a partial cross-sectional view of the power module of the present example. In this figure, only two of the six IGBT chips are visible. These two chips are referenced respectively 1a and 1b. Furthermore, FIG. 1 shows a part of the electric connecting and thermal conductive means which are associated with these two chips.

Figure 1:
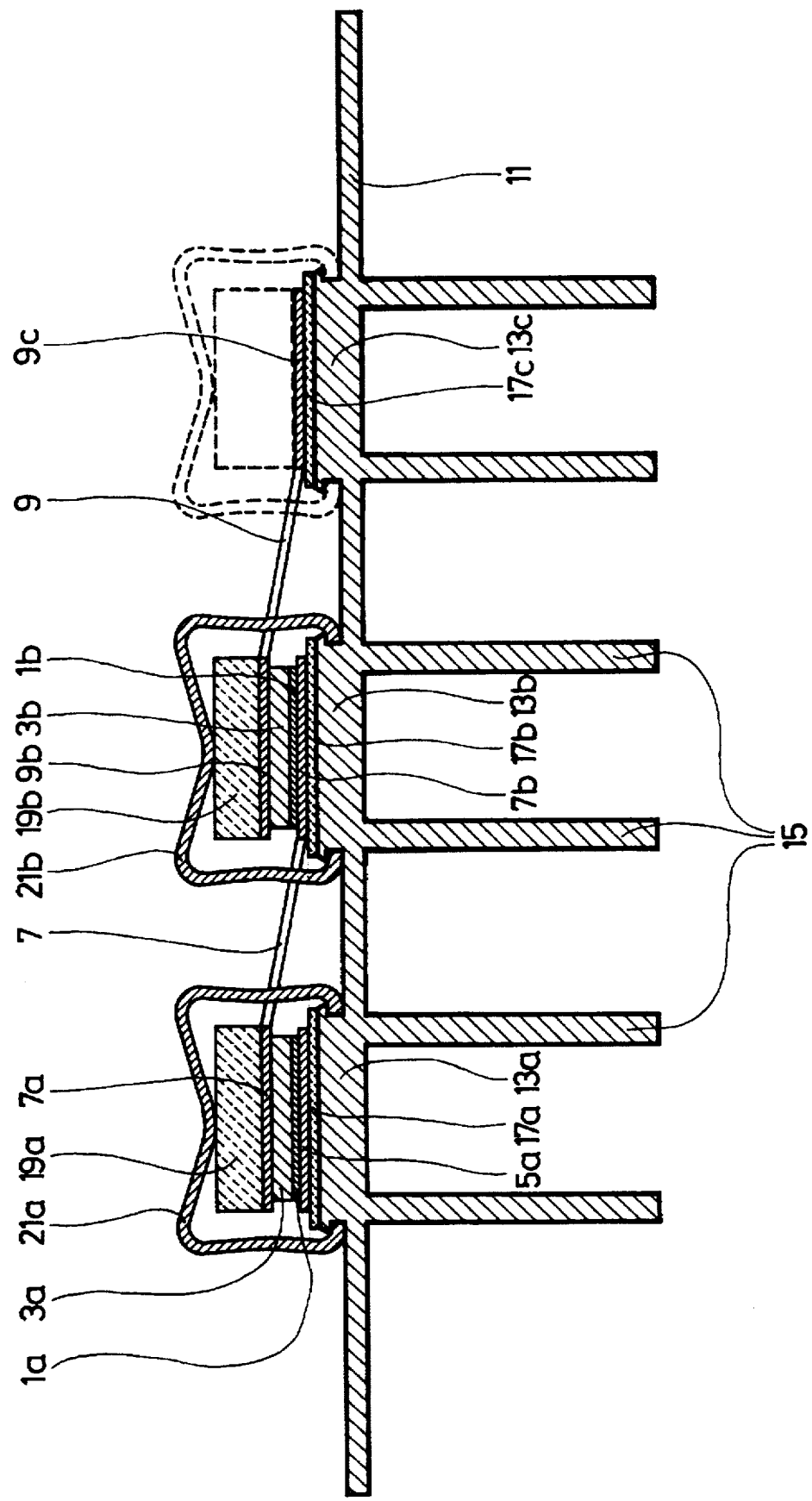
FIG. 1 is a cross-sectional view along the line I—I of FIG. 2.

Integrated circuits 1a and 1b each comprise a collecting contact pad and a transmitting contact pad situated respectively on the upper face and lower face of the chip. In the example of FIG. 1, it is the transmitting contact pad which is situated above. The IGBTs of the present example may, for example, be amongst others, Hitachi model "MBM-A/BS/GS". This IGBT model comprises, on its upper face, a gate contact pad in addition to the emitter contact pad.

One sees in FIG. 1 that the upper face of each of the IGBTs receives a emitter contact part which is preferably made of aluminium. The two emitter contact parts shown in FIG. 1 are respectively referenced 3a and 3b. The generally flat lower face of each of emitter contact parts 3a and 3b is locally engraved in recess so that it conforms to the surface of the emitter contact pad of the chip, while leaving an access open to the gate contact pad. The man skilled in the art will understand that by using IGBTs on which the gate contact pad is arranged differently, it would be possible to omit, for example, the engraving in recess of contact parts 3a and 3b.

The assemblies each formed by one of the IGBT chips and the emitter contact part which is associated with it, are sandwiched between an upper connecting part and a lower connecting part. In FIG. 1, the two connecting parts associated with chip 1a are respectively referenced 5a and 7a, and the two connecting parts associated with chip 1b are referenced 7b and 9b. These connecting parts may, for example, be made in copper or aluminium, and are provided both to assure the electric connection with the IGBTs and the dissipation of the heat produced at the emitter and collector contact pads. We will return to certain configuration peculiarities of these connecting parts below.

One also sees in FIG. 1 that the different elements of the module are mounted on a support plate referenced 11. This support plate which is also visible in FIG. 2 may be made, for example, of extruded aluminium. In the present example, the support plate consists of three raised fixing strips which are respectively referenced 13a, 13b and 13c. As one can see in FIG. 2, in the present example, each fixing strip is provided for receiving three IGBTs.

Referring once more to FIG. 1, one sees that, in this example, support plate 11 also comprises heat dissipating means, formed by six gills which are collectively referenced 15 and are placed directly under fixing strips 13a, 13b and 13b provided for receiving the integrated power circuits and the connecting means associated with them. It will be noted in this regard that instead and in place of the gills, the lower part of the support plate may be provided with cooling channels in which a heat exchanging fluid circulates.

One also sees in FIG. 1 that a fine ceramic layer referenced 17a is inserted between lower connecting part 5a and fixing strip 13a. Likewise, a fine ceramic layer 17b is inserted between lower connecting part 7b and fixing strip 13b. These two connecting layers are provided both to insulate electrically connecting parts 5a and 7b from fixing strips 13a and 13b, and to enable the heat to flow from the connecting parts to support plate 11.

In the present example, upper connecting parts 7a and 9b are each capped with a ceramic cap (these caps are respectively referenced 19a and 19b). One sees, further, that two U springs 21a and 21b are respectively fixed by their ends to fixing strips 13a and 13b. Each of springs 21a and 21b abuts with its middle part one of caps 19a and 19b so as to bias this cap in the direction of the fixing strip which, amongst others, it abuts. Thus, it will be understood that here, in conformity with the present invention the elements forming each of the sandwich structures which have just been described, are compressed together via the action of one of springs 21a and 21b. It will be noted, furthermore, that springs 21a and 21b work under tension. Indeed, each of them is held between, on the one hand, one of fixing strips 13a or 13b, and on the other hand, one of caps 19a and 19b.

It will be understood that, as a result of the construction which has just been described, each of the emitter and collector contact pads of chips 1a and 1b is held in both electric and thermal contact with one of connecting parts 5a, 7a, 7b and 9b. The pressure exerted by each of the springs is sufficient to maintain the contact between the different parts which are pressed against each other. It is thus unnecessary to use bonding. Furthermore, since the faces of the parts which touch each other are flat, the shearing stress which is normally produced by expansion along a joint between two parts, merely results in one face sliding against another. Any risk of deterioration in the electric contact quality as a result of temperature variations is consequently removed.

Referring once more to FIG. 1, one sees that connecting part 9c is also fixed to the top of the third fixing strip 13c. A thin ceramic layer 17c is inserted between fixing strip 13c and connecting part 9c. The thickness of the ceramic layer is chosen so that connecting part 9c is electrically insulated from fixing strip 13c, while being in thermal contact with the latter. We will return below to the function fulfilled by connecting part 9c in the present example.

Until now, we have only discussed two IGBT chips. However, as will already have been noted, in the present example, fixing strip 13a which receives chip 1a also receives two other IGBTs respectively referenced 101a and 201a and, similarly, fixing strip 13b which receives chip 1b also receives two other IGBTs respectively referenced 101b and 201b. The six integrated circuits 1a, 1b, 101a, 101b, 201a and 201b are all identical.

Figure 2:
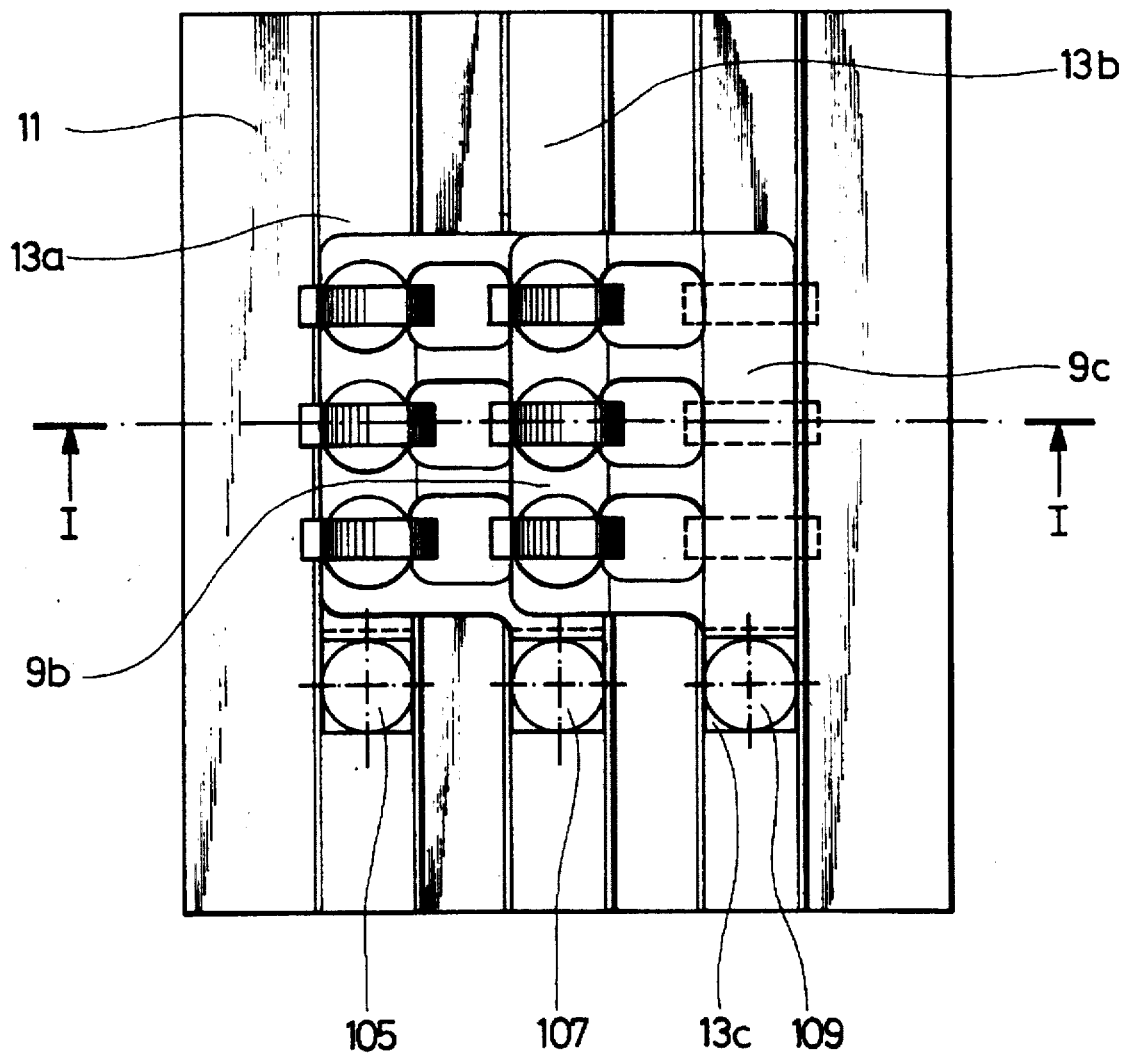
FIG. 2 is a top view of a power module according to a first embodiment of the present invention, the cover of the module having been removed to enable the interior to be seen.

One also sees in FIG. 2 that upper connecting part 9b is, in fact, a connecting strip which is shared by the three IGBTs which are mounted on fixing strip 13b. Likewise, each of the other connecting parts 5a, 7a and 7b described in relation to IGBTs 1a and 1b is, in fact a connecting strip shared by three IGBTs. It will be understood therefore that the IGBTs which are mounted on a same fixing strip are connected to each other in parallel. Finally, it is to be noted that connecting part 9c which is mounted on fixing strip 13c also has the shape of a strip.

We have just seen that connecting strips 5a, 7a, 7b and 9b enable the IGBTs to be connected in parallel, we will see now how these connecting parts enable the IGBTs to be connected in series. One sees in FIGS. 1 and 2 that connecting strip 9b which connects chips 1b, 101b and 201b together forms, in fact, a side of a metal plate 9 whose other side is formed by connecting strip 9c which is fixed to fixing strip 13c. Likewise, although FIG. 2 does not show it, upper connecting strip 7a which connects the emitter contact pads of chips 1a, 101a and 201a forms half of a plate 7 whose other half is formed by lower connecting strip 7b which connects the collector contact pads of chips 1b, 101b and 201b.

As a result of the configuration which has just been described, plate 7 connects, in series, the two groups of IGBTs mounted respectively on fixing strips 13a and 13b. The man skilled in the art can confirm that the configuration which has just been described corresponds to the electronic diagram of FIG. 4. Plate 9 formed by connecting strips 9b and 9c may have an identical shape to that of plate 7. Plate 9 is provided for driving the heat produced at the emitter contact pads of chips 1b, 101b and 201b to fixing strip 13c and heat dissipating means 15.

The construction which has just been described thus enables, on the one hand, each of the IGBT contact pads to be connected and, on the other hand, to provide escape paths for the heat from all the contact pads of the chips. Indeed, the collector contact pads of the IGBTs are in almost direct thermal contact with fixing strips 13a and 13b, and their emitter contact pads are thermally connected to fixing strips 13b and 13c via plates 7 and 9.

Figure 3:
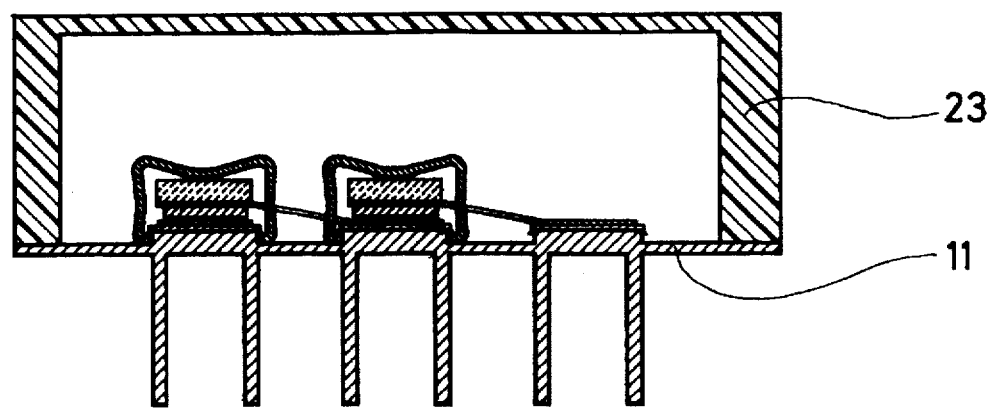
FIG. 3 is an identical cross-sectional view to FIG. 1 but with the module cover.
Figure 4:
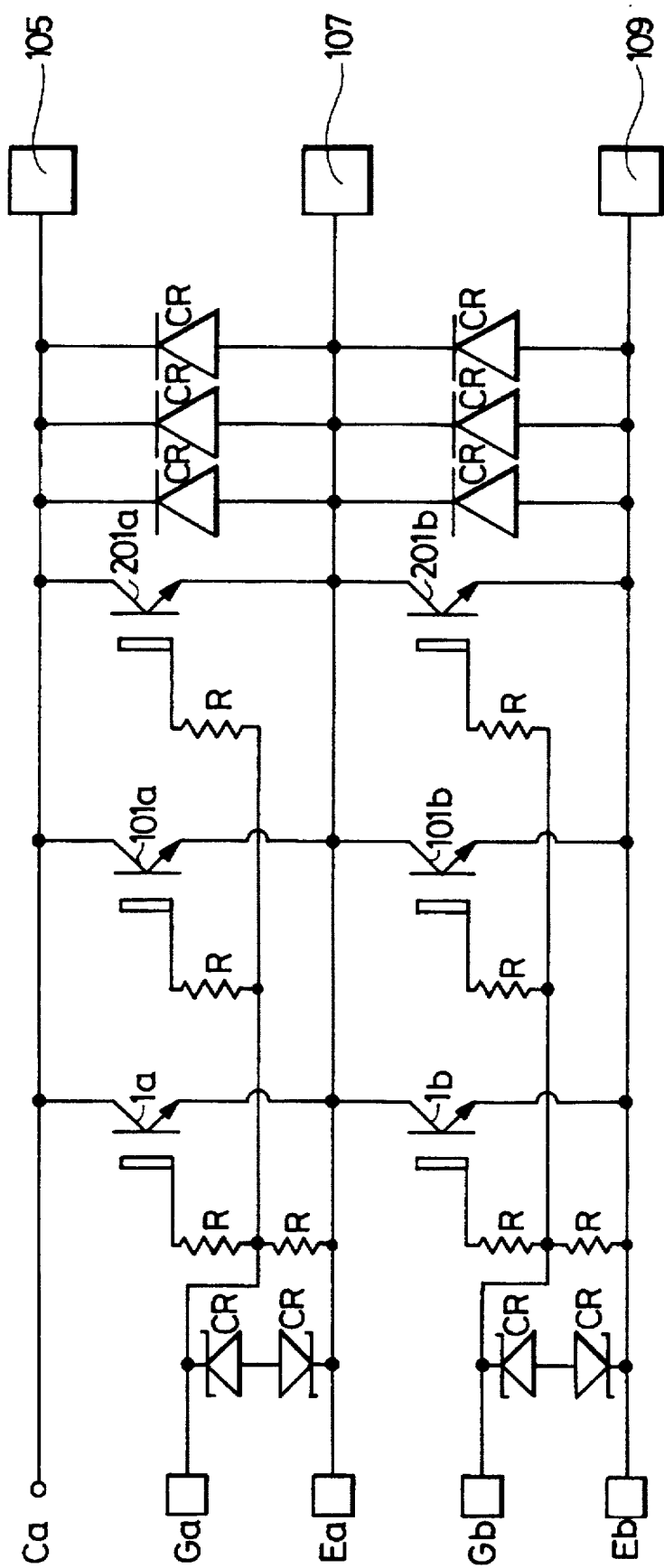
FIG. 4 is the electronic diagram corresponding to the module shown in FIGS. 1 to 3.

FIG. 3 shows schematically in cross-section a finished power module. One sees in particular that support plate 11 carries a cap 23 which encloses the integrated circuits and the electric connecting and thermal conductive means. In conformity with what is shown in FIG. 4, the power module of the present example contains other electronic circuit elements such as, for example, means for connecting the IGBT gate contact pads. However, these other circuit elements do not convey high currents and, consequently, they may be achieved in a conventional manner. It is for this reason that the other circuit elements have not been shown in FIGS. 1 to 3.

In order to finish with this first example of a power module according to the present invention, we will give, solely by way of example, a way of connecting the IGBTs to the exterior of the power module. If one refers again to FIG. 2, one sees that the two lower connecting strips 5a and 7b extend and form two connecting lugs respectively referenced 105 and 107. Connecting lugs 105 forms a connecting pin with the emitter contact pads of chips 1a, 101a and 201a and connecting lug 107 forms a connecting pin with, on the one hand, the emitter contact pads of chips 1a, 101a and 201a and, on the other hand, the collector contact pads of chips 1b, 101b and 201b. One sees finally in FIG. 2 that connecting strip 9c extends and forms a connecting lug referenced 109. Connecting tab 109 forms a connecting pin with the emitter contact pads of chips 1b, 101b and 201b.

What is claimed is:

1. An electronic power module comprising at least a first and a second integrated power circuits, each of said integrated circuits comprising two faces which are parallel and opposite to each other, each of said faces comprising integrated circuit contact pads, said module also comprising electric connecting and thermal conductive means for, on the one hand, connecting said contact pads to the exterior of said module and on the other hand, dissipating the heat produced by said integrated circuits, said electric connecting and thermal conductive means comprising in particular fixing strips made of a heat conducting material and thermally connected to heat dissipating means, and upper connecting parts made of an electric and heat conducting material, said first integrated circuit being arranged between a first of said fixing strips and a first of said upper connecting parts, and said second integrated circuit being arranged between a second of said fixing strips and a second of said upper connecting parts, said first and second fixing strips each having an upper face parallel and opposite to a first of said faces, called the lower face, of one of said first and second integrated circuits, and said first and second upper connecting parts each comprising a lower face which is parallel and opposite to a second of said faces, called the upper face, of one of said first and second integrated circuits, a first and a second spring being also provided for biaising respectively said first and second upper connecting parts in the direction of said first and second fixing strips so as to compress said first and second integrated circuits and thus to make an electric and thermal contact between said faces of the integrated circuits and said electric connecting and thermal conductive means, wherein said first and second springs are attached to said first and second fixing strips so as to work under tension.

2. An electronic power module according to claim 1, wherein said second upper connecting part is formed by a part of a plate another part of which forms a first lower connecting part arranged between said first integrated circuit and said first fixing strip, so that the heat produced by said second integrated circuit at its upper face is driven to said first fixing strip and that said second integrated circuit is electrically connected to said first integrated circuit via said upper face of said second integrated circuit.

3. An electronic power module according to claim 1, wherein said springs are made of a conducting material and in that caps made of an insulating material are respectively inserted between, on the one hand, said upper connecting parts and, on the other hand, said springs so as to insulate said upper connecting parts from said fixing strips.

4. An electronic power module according to claim 1, wherein a second lower connecting part is arranged between said second integrated circuit and said second fixing strip, and in that insulating layers separate said lower connecting parts from said fixing strips.

5. An electronic power module according to claim 1, wherein insulating layers separate said fixing strips from said heat dissipating means.

6. An electronic power module according to claims 1, wherein said first upper connecting part is formed by a part of a metal plate another part of which forms an additional lower connecting part attached to an additional fixing strip so that the heat produced by said first integrated circuit at its upper face is driven to said additional fixing strip.

7. An electronic power module according to claim 6, wherein said contact pads of said first and second integrated circuits are connected to the exterior of said module by said first and second lower connecting parts and by said additional lower connecting part.

8. An electronic power module according to claim 7, further comprising a third integrated power circuit connected in parallel to either said first integrated power circuit or to said second integrated power circuit.

9. An electronic power module according to claim 8, wherein a first of said contact pads of said third integrated circuit is juxtaposed with an extension of either said first lower connecting part or said second lower connecting part.

10. An electronic power circuit according to claim 9, wherein said extension of said first lower connecting part or of said second lower connecting part is sandwiched between, on the one hand, said third integrated power circuit and, on the other hand, respectively an extension of the first or second fixing strip.

* * * * *